(12) United States Patent
Mikami

(10) Patent No.: US 9,147,556 B2
(45) Date of Patent: Sep. 29, 2015

(54) PLASMA PROCESSING METHOD AND PLASMA PROCESSING APPARATUS

(71) Applicant: Tokyo Electron Limited, Tokyo (JP)

(72) Inventor: Shunichi Mikami, Miyagi (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 14/244,428

(22) Filed: Apr. 3, 2014

(65) Prior Publication Data

US 2014/0299576 A1    Oct. 9, 2014

(30) Foreign Application Priority Data

Apr. 5, 2013   (JP) .................................. 2013-079677

(51) Int. Cl.
*H01L 21/302*  (2006.01)
*H01J 37/32*  (2006.01)
*H01L 21/02*  (2006.01)

(52) U.S. Cl.
CPC ....... *H01J 37/32082* (2013.01); *H01L 21/0234* (2013.01); *H01J 2237/334* (2013.01)

(58) Field of Classification Search
CPC ..................... H01L 21/02312; H01L 21/0234; H01L 21/0232; H01L 21/32009; H01L 21/3065
USPC ......... 438/706, 710, 712, 714, 717, 720, 722, 438/723, 725, 736; 216/58, 75, 76; 156/345.24, 345.26, 345.29, 345.28
See application file for complete search history.

(56) References Cited

U.S. PATENT DOCUMENTS

| | | | |
|---|---|---|---|
| 6,692,903 B2* | 2/2004 | Chen et al. .................... 430/329 |
| 6,905,800 B1* | 6/2005 | Yuen et al. ....................... 430/5 |
| 2006/0191555 A1* | 8/2006 | Yoshida et al. ................ 134/1.1 |
| 2008/0190893 A1* | 8/2008 | Mori et al. ...................... 216/61 |

FOREIGN PATENT DOCUMENTS

JP       2006-216964 A       8/2006

* cited by examiner

*Primary Examiner* — Lan Vinh
(74) *Attorney, Agent, or Firm* — Brundidge & Stanger, P.C.

(57) ABSTRACT

A plasma processing method includes an etching process of etching an insulating film formed on a processing target object in a chamber by plasma of a first fluorine-containing gas with a TiN film having a preset pattern as a mask; a modifying process of modifying, between a carbon-containing film and a Ti-containing film adhering to a component within the chamber, a surface of the Ti-containing film by plasma of an oxygen-containing gas while removing the carbon-containing film by the plasma of the oxygen-containing gas, after the etching process; a first removing process of removing a TiO film, which is obtained by modifying the surface of the Ti-containing film, by plasma of a second fluorine-containing gas; and a second removing process of removing a residual film of the Ti-containing film, which is exposed by removing the TiO film, from the component within the chamber by plasma of a chlorine-containing gas.

6 Claims, 8 Drawing Sheets

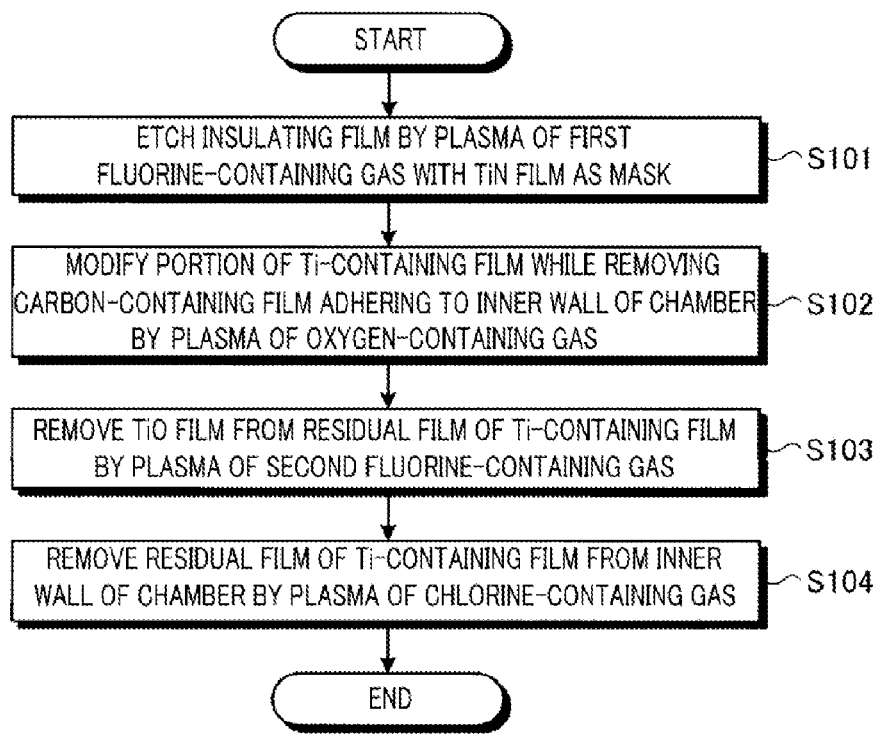
FIG. 2
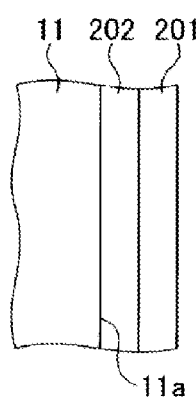 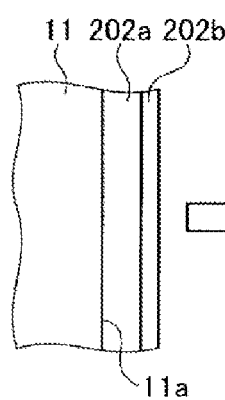 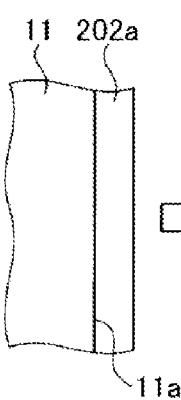 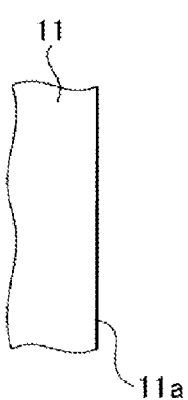
FIG. 3A    FIG. 3B    FIG. 3C    FIG. 3D

PLASMA PROCESSING METHOD AND PLASMA PROCESSING APPARATUS

CROSS-REFERENCE TO RELATED APPLICATION

This application claims the benefit of Japanese Patent Application No. 2013-079677 filed on Apr. 5, 2013, the entire disclosures of which are incorporated herein by reference.

TECHNICAL FIELD

The embodiments described herein pertain generally to a plasma processing method and a plasma processing apparatus.

BACKGROUND

In a semiconductor manufacturing process, a plasma processing apparatus configured to perform a plasma process in order to deposit or etch a thin film has been widely employed. As an example of such a plasma processing apparatus, there is known a plasma CVD (Chemical Vapor Deposition) apparatus configured to deposit a thin film or a plasma etching apparatus configured to perform an etching process.

The plasma processing apparatus includes, for example, a chamber in which a plasma process is performed on a processing target object, a gas exhaust unit configured to depressurize the inside of the chamber, a gas supply unit configured to supply a processing gas into the chamber, and so forth. Further, the plasma processing apparatus also includes a plasma generation device configured to supply electromagnetic energy such as a microwave or a RF wave in order to excite a processing gas in the chamber into plasma; and a bias voltage application device configured to apply a bias voltage and accelerate ions in the plasma toward the processing target object placed within the chamber.

In the plasma processing apparatus, when etching a processing target object on which an insulating film for dual damascene wiring is formed, there is known a technique of forming a mask having plasma resistance on a surface of the insulating film to form an etching pattern on the insulating film. For example, it is described in Patent Document 1 that a Ti-containing film (e.g., a TiN film) having a preset pattern is formed on a surface of an insulating film of a processing target object and the insulating film on the processing target object is etched by using the TiN film as a mask.

Patent Document 1: Japanese Patent Laid-open Publication No. 2006-216964

In this conventional method, however, there has been a risk of degrading etching characteristics with a lapse of time due to a Ti-containing film adhering to the inside of the chamber. That is, in the convention method, not only the insulating film but also the TiN film itself may be etched when the insulating film on the processing target objet is etched by using the TiN film as a mask. Accordingly, in the conventional method, the Ti-containing film originated from the etched TiN film may adhere to various components within the chamber, so that plasma density fluctuates within the chamber. As a result, the etching characteristics of the processing target object may be degraded as time passes by. This degradation of the etching characteristics may become remarkable when processing multiple lots of processing target objects.

SUMMARY

In accordance with example embodiments, a plasma processing method includes an etching process, a modifying process, a first removing process and a second removing process. In the etching process, an insulating film formed on a processing target object placed in a chamber is etched by plasma of a first fluorine-containing gas with a TiN film having a preset pattern as a mask. In the modifying process, between a carbon-containing film and a Ti-containing film adhering to a component within the chamber, a surface of the Ti-containing film is modified by plasma of an oxygen-containing gas while removing the carbon-containing film by the plasma of the oxygen-containing gas, after the etching process. In the first removing process, a TiO film, which is obtained by modifying the surface of the Ti-containing film, is removed by plasma of a second fluorine-containing gas. In the second removing process, a residual film of the Ti-containing film, which is exposed by removing the TiO film, is removed from the component within the chamber by plasma of a chlorine-containing gas.

In one example embodiment, a plasma processing method includes an etching process of etching an insulating film formed on a processing target object placed in a chamber by plasma of a first fluorine-containing gas with a TiN film having a preset pattern as a mask; a modifying process of modifying, between a carbon-containing film and a Ti-containing film adhering to a component within the chamber, a surface of the Ti-containing film by plasma of an oxygen-containing gas while removing the carbon-containing film by the plasma of the oxygen-containing gas, after the etching process; a first removing process of removing a TiO film, which is obtained by modifying the surface of the Ti-containing film, by plasma of a second fluorine-containing gas; and a second removing process of removing a residual film of the Ti-containing film, which is exposed by removing the TiO film, from the component within the chamber by plasma of a chlorine-containing gas.

The second fluorine-containing gas may include $CF_4$ or $SF_6$.

The second fluorine-containing gas may further include $O_2$.

The chlorine-containing gas may include at least one of $Cl_2$, $BCl_3$ and $SiCl_4$.

The modifying process, the first removing process and the second removing process may be performed after unloading the processing target object from the chamber.

The plasma processing method may further include a patterning process of forming the preset pattern on the TiN film, before the etching process.

The second removing process may be performed at a pressure lower than that in the first removing process.

In another example embodiment, a plasma processing apparatus includes a chamber in which a plasma process is performed on a processing target object; a gas exhaust unit configured to depressurize an inside of the chamber; a gas supply unit configured to supply a processing gas into the chamber; and a control unit configured to perform an etching process of etching an insulating film formed on the processing target object placed in the chamber by plasma of a first fluorine-containing gas with a TiN film having a preset pattern as a mask; a modifying process of modifying, between a carbon-containing film and a Ti-containing film adhering to a component within the chamber, a surface of the Ti-containing film by plasma of an oxygen-containing gas while removing the carbon-containing film by the plasma of the oxygen-containing gas, after the etching process; a first removing process of removing a TiO film, which is obtained by modifying the surface of the Ti-containing film, by plasma of a second fluorine-containing gas; and a second removing process of removing a residual film of the Ti-containing film, which is exposed by removing the TiO film, from the component within the chamber by plasma of a chlorine-containing gas.

In accordance with the example embodiments, it is possible to provide a plasma processing method and a plasma processing apparatus, capable of suppressing etching characteristics from being degraded with a lapse of time due to the Ti-containing film adhering to the inside of the chamber.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2 is a flowchart for describing a sequence of a plasma processing method performed by the plasma processing apparatus in accordance with the example embodiment;

FIG. 3A to FIG. 3D are explanatory diagrams for describing the plasma processing method performed by the plasma processing apparatus in accordance with the example embodiment;

DETAILED DESCRIPTION

Figure 1:
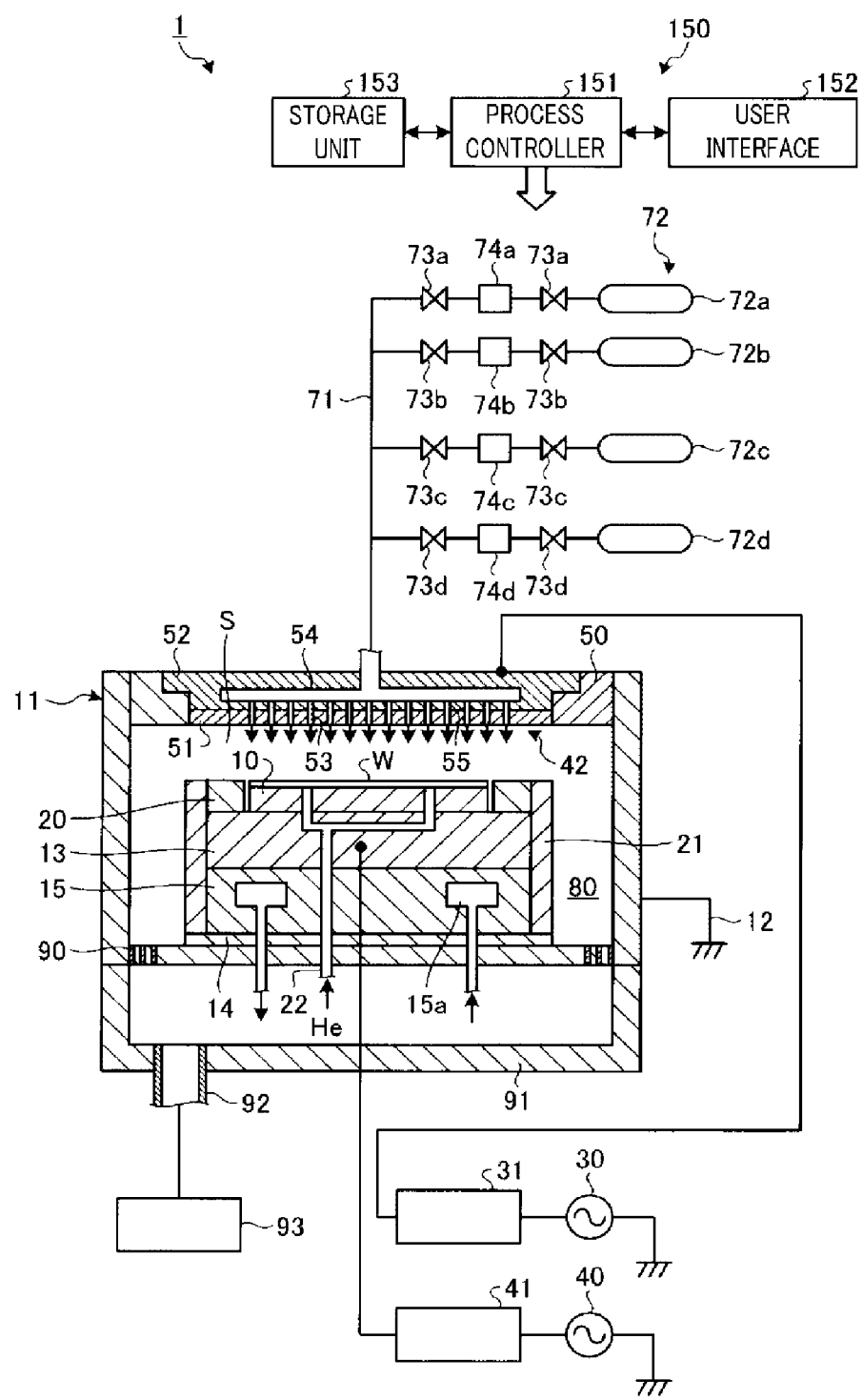
FIG. 1 is a longitudinal cross sectional view illustrating a schematic configuration of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a longitudinal cross sectional view illustrating a schematic configuration of a plasma processing apparatus in accordance with an example embodiment. As depicted in FIG. 1, the plasma processing apparatus 1 includes a substantially cylindrical chamber 11 having therein a plasma processing space S for performing a plasma process therein. The chamber 11 is electrically grounded via a ground line 12.

A wafer chuck 10 configured to hold a wafer W as a processing target object is provided in the chamber 11. The wafer chuck 10 is supported on a susceptor 13 serving as a lower electrode. The susceptor 13 is made of a metal such as, but not limited to, aluminum and has a substantially disk shape. A supporting table 15 is provided on an insulating plate 14 on a bottom of the chamber 11, and the susceptor 13 is supported on a top surface of the supporting table 15. An electrode (not shown) is embedded in the wafer chuck 10, and the wafer chuck 10 is configured to attract and hold the wafer W by an electrostatic force generated by applying a DC voltage to the electrode.

A conductive focus ring 20 made of, but not limited to, silicon is provided on a top surface of the susceptor 13 to surround the wafer chuck 10. The focus ring 20 serves to improve uniformity of a plasma process. Outer side surfaces of the susceptor 13, the supporting table 15 and the focus ring 20 are covered by a cylindrical member 21 made of, for example, quartz.

A coolant path 15a for allowing a coolant to flow therein is formed in, for example, a circular ring shape within the supporting table 15. By adjusting a temperature of the coolant supplied into the coolant path 15a, a temperature of the wafer W held on the wafer chuck 10 can be controlled. A heat transfer gas line 22 for supplying a heat transfer gas, e.g., a helium gas to a gap between the wafer chuck 10 and the wafer W held on the wafer chuck 10 is provided to penetrate the susceptor 13, the supporting table 15 and the insulating plate 14, for example.

A first high frequency power supply 30 for applying a high frequency power to an electrode supporting body 52 of an upper electrode 42 to generate plasma is electrically connected to the electrode supporting body 52 via a first matching device 31. The first high supply power supply 30 is configured to output a high frequency power of a frequency range from, e.g., about 27 MHz to about 100 MHz, e.g., about 40 MHz in the present example embodiment. The first matching device 31 is configured to match internal impedance of the first high frequency power supply 30 and load impedance, and to allow the internal impedance of the first high frequency power supply 30 and the load impedance to be apparently matched to each other when plasma is generated in the chamber 11.

Further, a second high frequency power supply 40 for applying a bias voltage by applying a high frequency power to the susceptor 13 to attract ions into the wafer W is electrically connected to the susceptor 13 via a second matching device 41. The second high frequency power supply 40 is configured to output a high frequency power of a frequency range from, e.g., about 400 kHz to about 13.56 MHz, lower than the frequency of the high frequency power outputted from the first high frequency power supply 30. In the present example embodiment, the second high frequency power supply 40 is configured to output a high frequency power of, e.g., about 13.56 MHz. Like the first matching device 31, the second matching device 41 is also configured to match internal impedance of the second high frequency power supply 40 and load impedance. In the following description, the high frequency powers outputted from the first high frequency power supply 30 and the high frequency power outputted from the second high frequency power supply 40 may be referred to as a "high frequency power HF" and a "high frequency power LF", respectively.

The upper electrode 42 is provided above the susceptor 13, facing the susceptor 13 in parallel. The upper electrode 42 is supported at a top portion of the chamber 11 by being supported by the insulating supporting member 50. Accordingly, the upper electrode 42 is also electrically grounded like the chamber 11.

The upper electrode 42 includes an electrode plate 51 forming a surface facing the wafer W held on the wafer chuck 10; and the electrode supporting body 52 supporting the electrode plate 51 from above. A multiple number of gas discharge holes 53 are formed through the electrode plate 51, and a processing gas is supplied into the chamber 11 through the gas discharge holes 53. The electrode plate 51 is made of, but not limited to, a semiconductor or a conductor having low Joule heat and low resistance. In the present example, the electrode plate 51 is made of silicon, for example.

The electrode supporting body 52 is made of a conductor, and, in the present example embodiment, aluminum is used, for example. A gas diffusion space 54 having a substantially disk shape is formed in a central portion within the electrode supporting body 52. A multiple number of gas holes 55 extended downward from the gas diffusion space 54 are formed in a lower portion of the electrode supporting body 52, and the gas discharge holes 53 are connected to the gas diffusion space 54 through the gas holes 55.

A gas supply line 71 is connected to the gas diffusion space 54. The gas supply line 71 is connected to a processing gas supply source 72 as illustrated in FIG. 1, and a processing gas supplied from the processing gas supply source 72 is introduced into the gas diffusion space 54 via the gas supply line 71. The processing gas supplied into the gas diffusion space 54 is then introduced into the chamber 11 through the gas holes 55 and the gas discharge holes 53. That is, the upper electrode 42 serves as a shower head configured to supply the processing gas into the chamber 11.

In the present example embodiment, the processing gas supply source 72 includes a gas supply unit 72a, a gas supply unit 72b, a gas supply unit 72c and a gas supply unit 72d. The gas supply unit 72a is configured to supply a first fluorine-containing gas as an etching gas into the plasma processing space S. The first fluorine-containing gas may be, but not limited to, $CF_4/C_4F_8/C_6F_6/Ar$.

The gas supply unit 72b is configured to supply an oxygen-containing gas as a removing gas of deposit generated after an etching process into the plasma processing space S. The oxygen-containing gas may be, but not limited to, $O_2$.

The gas supply unit 72c is configured to supply a second fluorine-containing gas as a removing gas of deposit generated after the etching process into the plasma processing space S. The second fluorine-containing gas may include, but not limited to, $CF_4$ or $SF_6$. The second fluorine-containing gas may further include $O_2$.

The gas supply unit 72d is configured to supply a chlorine-containing gas as a removing gas of deposit generated after the etching process into the plasma processing space S. The chlorine-containing gas may include at least one of $Cl_2$, $BCl_3$ and $SiCl_4$.

Further, the processing gas supply source 72 may include other gas supply units configured to supply various gases into the plasma processing space S in addition to the gas supply units 72a to 72d.

The processing gas supply source 72 also includes valves 73a, 73b, 73c and 73d and flow rate controllers 74a, 74b, 74c and 74d provided between the gas supply units 72a, 72b, 72c and 72d and the gas diffusion space 54, respectively. The flow rates of the gases supplied into the gas diffusion space 54 are controlled by the flow rate controllers 74a, 74b, 74c and 74d.

A gas exhaust path 80 is formed by an inner wall of the chamber 11 and the outer side surface of the cylindrical member 21 at a bottom portion of the chamber 11. The gas exhaust path 80 serves as a flow path for exhausting an atmosphere within the chamber 11 to the outside of the chamber 11. A gas exhaust opening 90 is formed on a bottom surface of the chamber 11. A gas exhaust chamber 91 is provided under the gas exhaust opening 90, and a gas exhaust device 93 is connected to the gas exhaust chamber 91 via a gas exhaust line 92. By operating the gas exhaust device 93, the atmosphere within the chamber 11 is exhausted through the gas exhaust path 80 and the gas exhaust opening 90, so that the inside of the processing chamber can be depressurized to have a preset vacuum level.

Further, a deposition shield (not shown) for suppressing an etching byproduct (deposit) from adhering to the chamber 11 is detachably provided on the inner wall of the chamber 11. In the following description, the term "inner wall of the chamber 11" may refer to the inner wall of the chamber 11 and the deposition shield thereon together.

An overall operation of the above-described plasma processing apparatus 1 is controlled by a control unit 150. The control unit 150 includes a process controller 151 having a CPU and is configured to control respective components of the plasma processing apparatus; a user interface 152; and a storage unit 153.

The user interface 152 may include a keyboard through which a process manager inputs commands to manage the plasma processing apparatus 1; a display that visually displays an operational status of the plasma processing apparatus 1; and so forth.

The storage unit 153 is configured to store therein control programs (software) for implementing various processes performed in the plasma processing apparatus 1 under the control of the process controller 151, or recipes including processing condition data and the like. In response to an instruction from the user interface 152 or the like, a necessary recipe is retrieved from the storage unit 153 and executed by the process controller 151, so that a desired process is performed in the plasma processing apparatus 1 under the control of the process controller 151. The control programs or the recipes including the processing condition data can be used while being stored on a computer-readable storage medium (e.g., a hard disk, a CD, a flexible disk, a semiconductor memory, etc.), or may be used on-line by being received from another apparatus through, for example, a dedicated line, whenever necessary.

By way of example, the control unit 150 may control the respective components of the plasma processing apparatus 1 to perform a plasma processing method to be described below. To elaborate, the control unit 150 etches an insulating film by plasma of a first fluorine-containing gas with a TiN film, which is formed on a processing target object placed within the chamber 11 and has a preset pattern, as a mask. After the insulating film is etched, the control unit 150 removes, between a carbon-containing film and a Ti-containing film adhering to components within the chamber 11, the carbon-containing film by plasma of an oxygen-containing gas while concurrently modifying a surface of the Ti-containing film by the plasma of the oxygen-containing gas. Then, the control unit 150 removes a TiO film, which is obtained as a result of the surface modification of the Ti-containing film, by plasma of a second fluorine-containing gas. Thereafter, the control unit 150 removes a residual portion of the Ti-containing film, which is exposed after the TiO film is removed, from the components within the chamber 11 by plasma of a chlorine-containing gas.

Here, the components within the chamber 11 may include, by way of non-limiting example, the inner wall of the chamber 11, the focus ring 20, the cylindrical member 21, the supporting member 50, the electrode plate 51, and so forth. Further, the processing target object may refer to, for example, a wafer W on which an insulating film and a TiN film having a preset pattern are deposited in sequence. Here, the insulating film may be, but not limited to, an interlayer insulating film for dual damascene wiring and may be made of a low permittivity material, such as SiOCH, having a relative permittivity equal to or less than a preset value (e.g., about 4.2).

Now, a sequence of the plasma processing method performed by the plasma processing apparatus 1 in accordance with the present example embodiment will be discussed. FIG. 2 is a flowchart for describing a sequence of the plasma processing method performed by the plasma processing apparatus 1 according to the present example embodiment. FIG. 3A to FIG. 3D are explanatory diagrams for describing the sequence of the plasma processing method performed by the plasma processing apparatus in accordance with the present example embodiment. FIG. 3A to FIG. 3D illustrate an example case of performing a series of plasma processes for removing a carbon-containing material and a Ti-containing material adhering to the inner wall 11a of the chamber 11 as one example component within the chamber 11 in the plasma processing apparatus 1.

As depicted in FIG. 2, at block S101 (Etch insulating film by plasma of first fluorine-containing gas with TiN film as mask), the control unit 150 of the plasma processing apparatus 1 performs an etching process of etching an insulating film by plasma of a first fluorine-containing gas with a TiN film of a preset pattern, which is formed on a processing target object placed within the chamber 11, as a mask. To elaborate, the control unit 150 supplies the first fluorine-containing gas into the chamber 11 from the processing gas supply source 72 and etches the insulating film by the plasma of the first fluorine-containing gas with the TiN film of the preset pattern as a mask. At this time, the TiN film used as the mask is also etched along with the insulating film. As a result, as illustrated in FIG. 3A, a carbon-containing film 201 generated from the insulating film and a Ti-containing film 202 generated from the TiN film may adhere to the inner wall 11a of the chamber 11. Here, the carbon-containing film 201 may include, but not limited to, a CF-based deposit, and the Ti-containing film 202 may include, but not limited to, TiF, TiO and TiOF. Further, the first fluorine-containing gas may include, but not limited to, $CF_4/C_4F_8/C_5F_6/Ar$.

A more detailed example of this process will be explained. The control unit 150 loads the processing target object on the wafer chuck 10. Then, the control unit 150 introduces the first fluorine-containing gas into the chamber 11 from the upper electrode 42 serving as the shower head. Then, by applying a high frequency power for plasma generation to the inside of the chamber 11 from the first high frequency power supply 30, the plasma of the first fluorine-containing gas is generated. Further, the control unit 150 applies a high frequency power for ion attraction to the wafer chuck 10 from the second high frequency power supply 40, so that ions in the plasma are attracted toward the processing target object. Then, upon the completion of etching the insulating film on the processing target object, the control unit 150 unloads the processing target object out of the chamber 11 through a loading/unloading opening. That is, a modifying process, a first removing process and a second removing process supposed to be performed after the etching process, as will be described later, are conducted after the processing target object is unloaded from the chamber 11. Processing may proceed from block S101 to block S102.

Subsequently, at block S102 (Modify portion of Ti-containing film while removing carbon-containing film adhering to inner wall of chamber by plasma of oxygen-containing gas), the control unit 150 performs a modifying process of modifying a surface of the Ti-containing film 202 by plasma of an oxygen-containing gas while concurrently removing the carbon-containing film 201 adhering to the inner wall 11a of the chamber 11 by the plasma of the oxygen-containing gas. As a result, as illustrated in FIG. 3B, the carbon-containing film 201 adhering to the inner wall 11a of the chamber 11 is removed; the surface of the Ti-containing film 202 is modified into a TiO film 202b; and a residual film 202a of the Ti-containing film 202 is left on the inner wall 11a. Here, the oxygen-containing gas may be, for example, $O_2$.

A more specific example will be explained. The control unit 150 introduces the oxygen-containing gas into the chamber 11 from the upper electrode 42 serving as the shower head after unloading the processing target object from the chamber 11. By applying the high frequency power for plasma generation to the inside of the chamber 11 from the first high frequency power supply 30, the plasma of the oxygen-containing gas is generated. At this time, the control unit 150 does not apply the high frequency power for ion attraction from the second high frequency power supply 40. Further, the control unit 150 continues this process until the carbon-containing film 201 adhering to the inner wall 11a of the chamber 11 is completely removed and the surface of the Ti-containing film 202 is modified to obtain the TiO film 202b. Processing may proceed from block S102 to block S103.

Thereafter, at block S103 (Remove TiO film from residual film of Ti-containing film by plasma of second fluorine-containing gas), the control unit 150 performs a first removing process of removing the TiO film 202b from the residual film 202a of the Ti-containing film 202 by plasma of a second fluorine-containing gas. As a result, as illustrated in FIG. 3C, the residual film 202a of the Ti-containing film 202 is exposed. Here, the second fluorine-containing gas may include $CF_4$ or $SF_6$. Desirably, the second fluorine-containing gas may further include $O_2$.

A more specific example will be explained. The control unit 150 introduces the second fluorine-containing gas into the chamber 11 from the upper electrode 42 serving as the shower head. Further, by applying the high frequency power for plasma generation to the inside of the chamber 11 from the first high frequency power supply 30, the plasma of the second fluorine-containing gas is generated. At this time, the control unit 150 does not apply the high frequency power for ion attraction from the second high frequency power supply 40. Further, the control unit 150 continues this process until the TiO film 202b is completely removed such that the residual film 202a of the Ti-containing film 202 is exposed. Processing may proceed from block S103 to block S104.

Subsequently, at block S104 (Remove residual film of Ti-containing film from inner wall of chamber by plasma of chlorine-containing gas), the control unit 150 performs a second removing process of removing the exposed residual film 202a of the Ti-containing film 202 from the inner wall 11a of the chamber 11 by plasma of a chlorine-containing gas. The second removing process is performed at a lower pressure than that of the first removing process. As a result, as illustrated in FIG. 3D, the residual film 202a of the Ti-containing film 202 is removed, so that the inner wall 11a is exposed. That is, since reactivity between TiF as a main component of the Ti-containing film 202 and the chlorine-containing gas is relatively high, the residual film 202a of the Ti-containing film 202 can be efficiently removed as TiCl (as a complex gas) which is produced as a result of a reaction between the residual film 202a of the Ti-containing film 202 and the plasma of the chlorine-containing gas. That is, this TiCl as the complex gas is exhausted from the chamber 11. Here, the chlorine-containing gas may include at least one of $Cl_2$, $BCl_3$ and $SiCl_4$.

A more detailed example will be explained. The control unit 150 introduces the chlorine-containing gas into the chamber 11 from the upper electrode 42 serving as the shower head. Then, by applying the high frequency power for plasma generation to the inside of the chamber 11 from the first high frequency power supply 30, the plasma of the chlorine-containing gas is generated. The control unit 150 continues this process until the residual film 202a of the Ti-containing film 202 is completed removed such that the inner wall 11a of the chamber 11 is exposed.

As stated above, after etching the insulating film with the TiN film as a mask, the plasma processing apparatus 1 in accordance with the present example embodiment performs the modifying process of modifying the surface of the Ti-containing film 202, between the carbon-containing film 201 and the Ti-containing film 202 adhering to the components within the chamber 11, by the plasma of the oxygen-containing gas while concurrently removing the carbon-containing film 201 by the plasma of the oxygen-containing gas. Then, the plasma processing apparatus 1 performs the first removing process of removing the TiO film 202b, which is obtained as a result of the surface modification of the Ti-containing film 202, from the residual film 202a of the Ti-containing film 202 by the plasma of the second fluorine-containing gas. Thereafter, the plasma processing apparatus 1 performs the second removing process of removing the residual film 202a of the Ti-containing film 202, which is exposed by removing the TiO film 202b, from the components within the chamber 11 by the plasma of the chlorine-containing gas. Accordingly, in accordance with the present example embodiment, even if the Ti-containing film 202 generated from the TiN film adheres to the various components within the chamber 11, it is possible to remove the Ti-containing film 202 from the various components, thus suppressing fluctuation of plasma density within the chamber 11. Consequently, according to the present example embodiment, it may be possible to suppress the etching characteristics from being degraded with a lapse of time due to the Ti-containing film 202 adhering to the inside of the chamber 11.

Figure 4A:
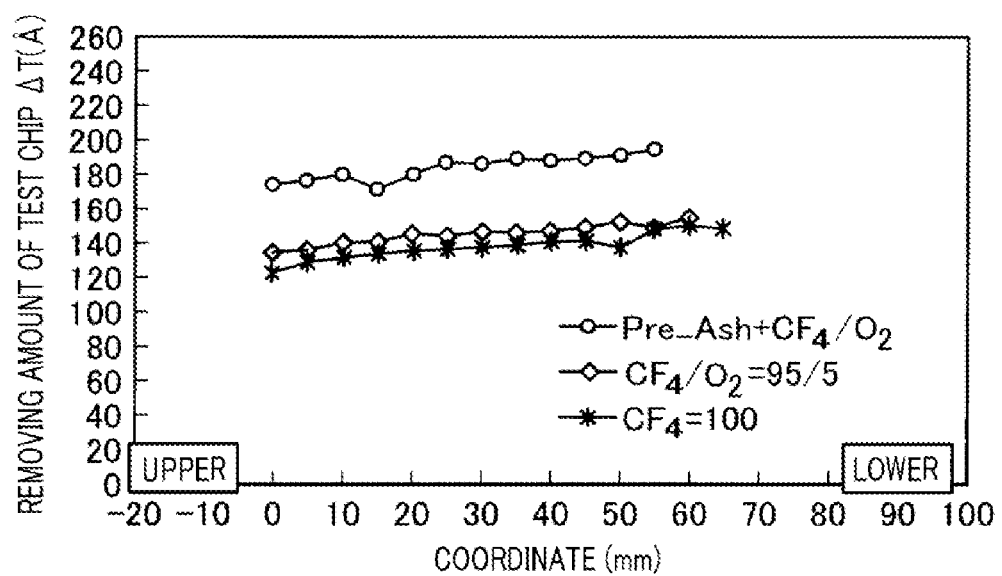
FIG. 4A is a chart for describing an effect of performing a first removing process after performing a modifying process in accordance with the example embodiment.
Figure 4B:
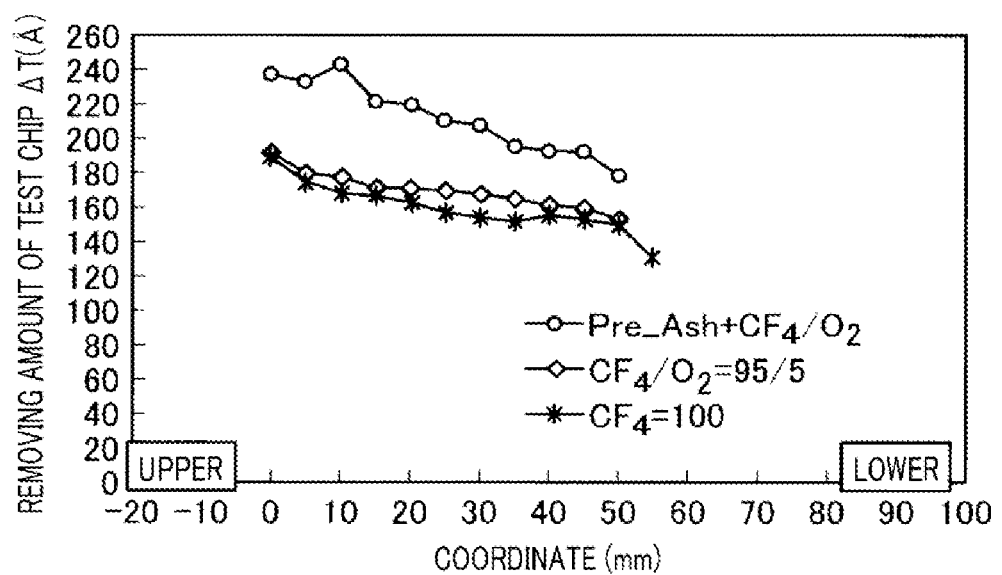
FIG. 4B is a chart for describing an effect of performing the first removing process after performing the modifying process in accordance with the example embodiment.

Now, the modifying process and the first removing process in accordance with the present example embodiment will be elaborated in more detail. FIG. 4A and FIG. 4B provide charts for describing an effect of performing the first removing process after performing the modifying process according to the present example embodiment. FIG. 4A and FIG. 4B show a relationship between various conditions and a removing amount of a Ti-containing film adhering to the inner wall 11a of the chamber 11. FIG. 4A provides a result of measuring a removing amount $\Delta T$ of a test chip serving as a sample of Ti-containing film (hereinafter, simply referred to as a "test chip") as a removing amount of the Ti-containing film when the test chip is placed at a preset position A on the inner wall 11a of the chamber 11. Meanwhile, FIG. 4B provides a result of measuring a removing amount $\Delta T$ of a test chip as a removing amount of the Ti-containing film when the test chip is placed at a preset position B, lower than the preset position A, on the inner wall 11a of the chamber 11. On each test chip, a TiN film and a TiO film are deposited in sequence as the Ti-containing film. An initial thickness of the test chip may be, e.g., about 250 Å.

In FIG. 4A and FIG. 4B, a vertical axis represents a removing amount $\Delta T$ (Å) of the test chip, and a horizontal axis represents a coordinate (mm) of a position in an extension direction of the test chip. Further, in FIG. 4A and FIG. 4B, a graph of '$CF_4$=100' shows a result of performing the first removing process by using about 100 sccm of $CF_4$ as the second fluorine-containing gas without performing the modifying process. A graph of '$CF_4/O_2$=95/5' shows a result of performing the first removing process by using about 95 sccm of $CF_4$ and about 5 sccm of $O_2$ as the second fluorine-containing gas without performing the modifying process. A graph of 'Pre–Ash+$CF_4/O_2$' indicates a result of performing the first removing process by using about 95 sccm of $CF_4$ and about 5 sccm of $O_2$ as the second fluorine-containing gas after performing the modifying process. Further, processing conditions for the modifying process are as follows: a processing time is about 30 seconds; a flow rate of $O_2$ used as a processing gas is about 350 sccm; a pressure is about 13 Pa (about 100 mT); and a high frequency power HF and a high frequency power LF are about 600 W and 0 W, respectively. Further, processing conditions for the first removing process are as follows: a processing time is about 30 seconds; a pressure is about 2.7 Pa (about 20 mT); and a high frequency power HF and a high frequency power LF are about 600 W and 0 W, respectively.

As depicted in FIG. 4A and FIG. 4B, in case of performing the first removing process after the first modifying process, a removing amount $\Delta T$ of the test chip is found to be increased, as compared to the case of performing the first removing process without performing the modifying process. That is, by performing the modifying process before the first removing process, it is possible to increase the removing amount of the Ti-containing film adhering to the inner wall 11a of the chamber 11, as compared to the case without performing the modifying process. This may be because the Ti-containing film is removed as a reaction product produced by a reaction between the second fluorine-containing gas used in the first removing process and the TiO film, which is obtained as a result of the surface modification of the Ti-containing film.

Figure 5:
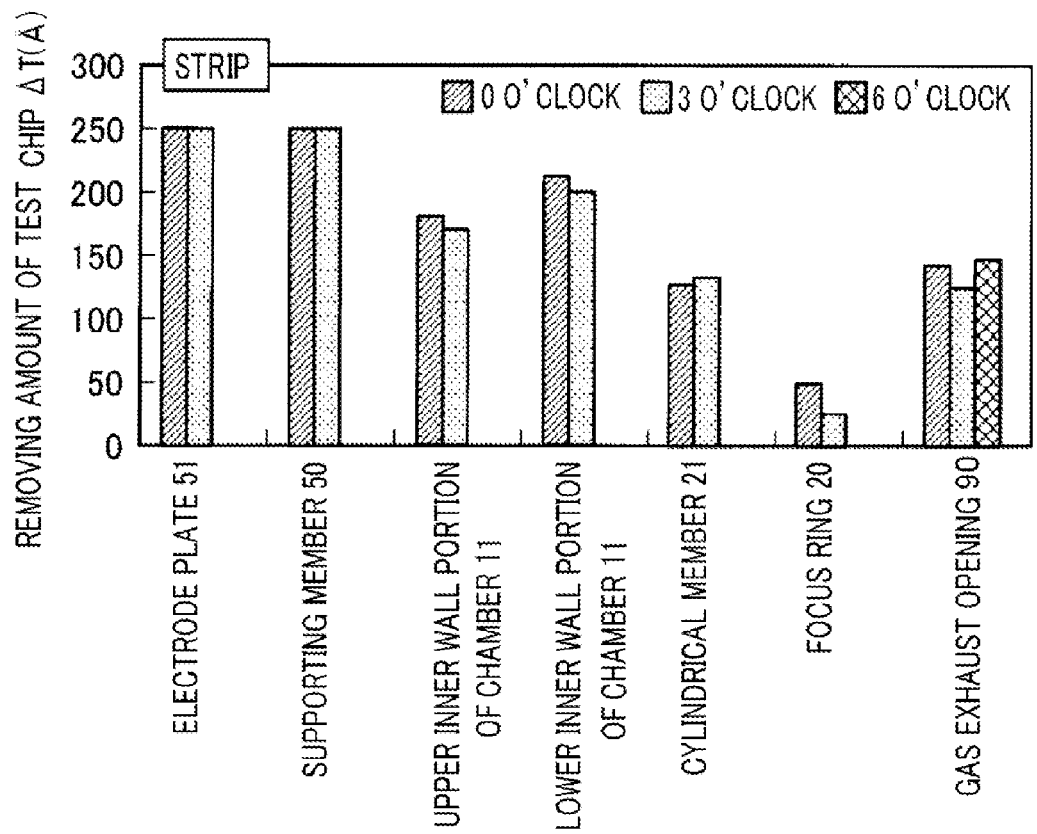
FIG. 5 is a chart for describing an effect of performing the first removing process after performing the modifying process in accordance with the example embodiment.

FIG. 5 provides a chart for describing an effect of performing the first removing process after performing the modifying process in the present example embodiment. FIG. 5 shows a removing amount of the Ti-containing film adhering to various components within the chamber 11. FIG. 5 provides results of measuring removing amounts ΔT of test chips, which are placed on the respective components within the chamber 11, as the removing amount of the Ti-containing film. Further, in FIG. 5, "0 o'clock" indicates a reference direction on a surface of the test chip; "3 o'clock," a direction rotated by about 90° from the reference direction; and "6 o'clock," a direction rotated by about 180° from the reference direction.

As depicted in FIG. 5, in case of performing the first removing process after performing the modifying process, the removing amounts 1T of the test chips placed on the other components than the inner wall 11a of the chamber 11, i.e., on the focus ring 20, the cylindrical member 21, the supporting member 50 and the electrode plate 51 are all found to be increased relatively.

Figure 6A:
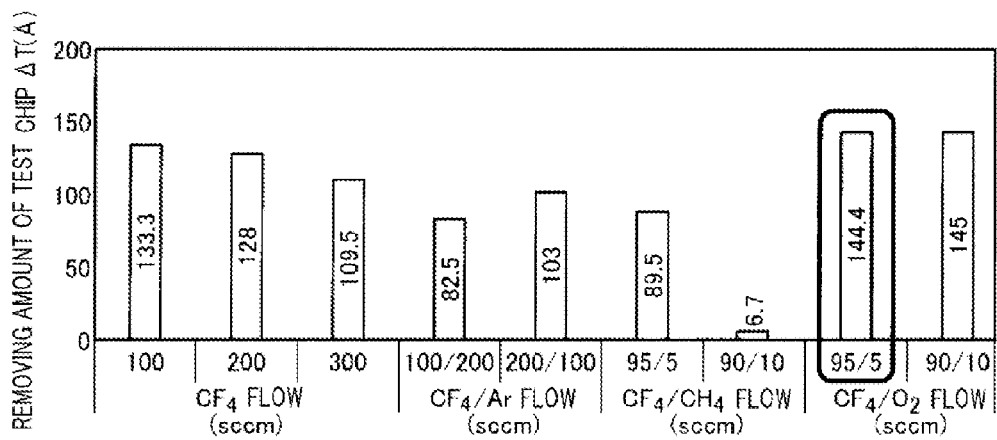
FIG. 6A is a chart showing a relationship between the kind of a second fluorine-containing gas used in the first removing process and a removing amount of a Ti-containing film in accordance with the example embodiment.
Figure 6B:
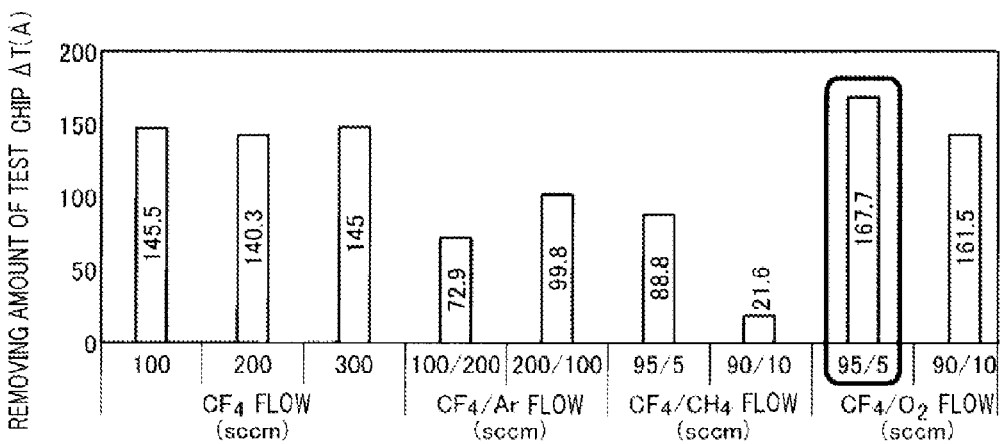
FIG. 6B is a chart showing a relationship between the kind of the second fluorine-containing gas used in the first removing process and the removing amount of the Ti-containing film in accordance with the example embodiment.

FIG. 6A and FIG. 6B are charts showing a relationship between the kind of the second fluorine-containing gas used in the first removing process and the removing amount of the Ti-containing film in the present example embodiment. FIG. 6A provides a result of measuring the removing amount ΔT of the test chip as the removing amount of a Ti-containing film when the test chip is placed at the preset position A on the inner wall 11a of the chamber 11. FIG. 6B provides a result of measuring the removing amount ΔT of the test chip as the removing amount of the Ti-containing film when the test chip is placed at the preset position B, lower than the preset position A, on the inner wall 11a of the chamber 11.

Further, FIG. 6A and FIG. 6B provide a result obtained when about 100 sccm of $CF_4$ is used as the second fluorine-containing gas in the first removing process, a result obtained when about 200 sccm of $CF_4$ is used as the second fluorine-containing gas in the first removing process, a result obtained when about 300 sccm of $CF_4$ is used as the second fluorine-containing gas in the first removing process, a result obtained when about 100 sccm of $CF_4$ and about 200 sccm of Ar are used as the second fluorine-containing gas in the first removing process, a result obtained when about 200 sccm of $CF_4$ and about 100 sccm of Ar are used as the second fluorine-containing gas in the first removing process, a result obtained when about 95 sccm of $CF_4$ and about 5 sccm of $CH_4$ are used as the second fluorine-containing gas in the first removing process, a result obtained when about 90 sccm of $CF_4$ and about 10 sccm of $CH_4$ are used as the second fluorine-containing gas in the first removing process, a result obtained when about 95 sccm of $CF_4$ and about 5 sccm of $O_2$ are used as the second fluorine-containing gas in the first removing process, and a result obtained when about 90 sccm of $CF_4$ and about 10 sccm of $O_2$ are used as the second fluorine-containing gas in the first removing process.

As can be seen from FIG. 6A and FIG. 6B, by using $CF_4$ or $CF_4/O_2$, it is possible to increase the removing amount ΔT of the test chip, as compared to the case of using $CF_4/Ar$ or $CF_4/CH_4$. Further, by using $CF_4/O_2$, it is possible to increase the removing amount ΔT of the test chip, as compared to the case of using $CF_4$.

As stated above, by selecting $CF_4$ or $CF_4/O_2$ as the second fluorine-containing gas in the first removing process, it is possible to increase the removing amount ΔT of the test chip, as compared to the case of using $CF_4/Ar$ or $CF_4/CH_4$. That is, by selecting $CF_4$ or $CF_4/O_2$ as the second fluorine-containing gas in the first removing process, it is possible to increase the removing amount of the Ti-containing film adhering to the inner wall 11a of the chamber 11, as compared to the case of using $CF_4/Ar$ or $CF_4/CH_4$. This may be because the Ti-containing film is removed as a reaction product produced by a reaction between the second fluorine-containing gas used in the first removing process and the TiO film, which is obtained as a result of surface modification of the Ti-containing film.

Figure 7A:
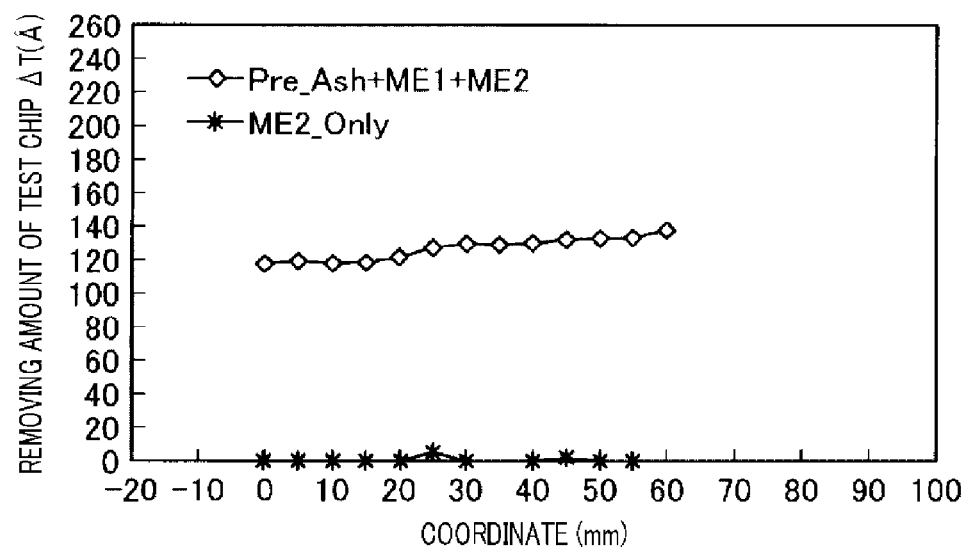
FIG. 7A is a chart for describing an effect of performing a second removing process after performing the first removing process in accordance with the example embodiment.
Figure 7B:
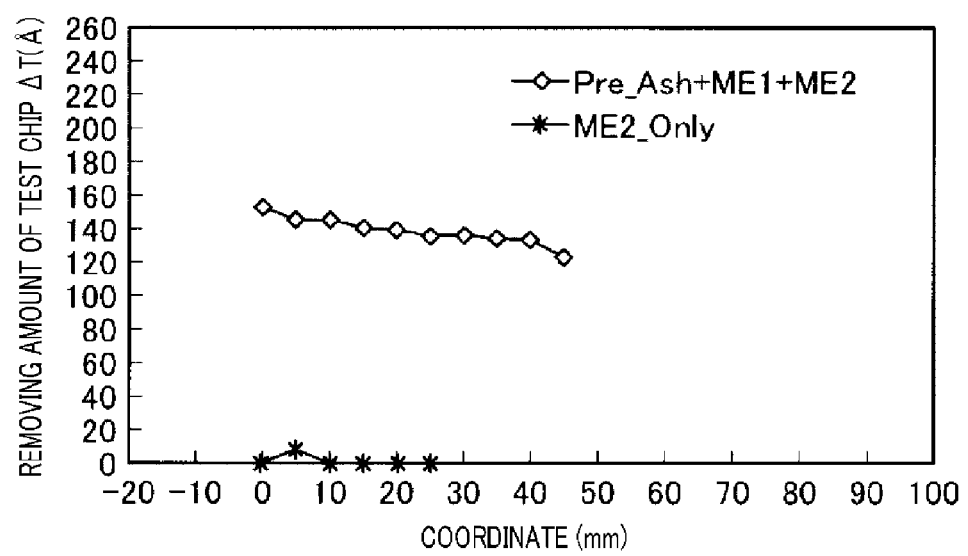
FIG. 7B is a chart for describing an effect of performing the second removing process after performing the first removing process in accordance with the example embodiment.

Now, the first removing process and the second removing process in the present example embodiment will be more elaborated. FIG. 7A and FIG. 7B are charts for describing an effect of performing the second removing process after performing the first removing process in the present example embodiment. FIG. 7A and FIG. 7B show a relationship between various conditions and a removing amount of the Ti-containing film adhering to the inner wall 11a of the chamber 11. FIG. 7A provides a result of measuring a removing amount ΔT of a test chip serving as a sample of a Ti-containing film (hereinafter, simply referred to as a "test chip") as a removing amount of the Ti-containing film when the test chip is placed at a preset position A on the inner wall 11a of the chamber 11. FIG. 7B provides a result of measuring a removing amount ΔT of the test chip as the removing amount of the Ti-containing film when the test chip is placed at a preset position B, lower than the preset position A, on the inner wall 11a of the chamber 11. On each test chip, a TiN film and a TiO film are deposited in sequence as the Ti-containing film. An initial thickness of the test chip may be, e.g., about 250 Å.

In FIG. 7A and FIG. 7B, a vertical axis represents a removing amount ΔT (Å) of the test chip, and a horizontal axis represents a coordinate (mm) of a position in an extension direction of the test chip. Further, in FIG. 7A and FIG. 7B, a graph of 'ME2_Only' shows a result of performing the second removing process by using about 150 sccm of $Cl_2$ as the chlorine-containing gas without performing the modifying process and the first removing process. A graph of 'Pre_Ash+ME1+ME2' shows a result of performing the second removing process by using about 150 sccm of $Cl_2$ as the chlorine-containing gas after performing the modifying process and the first removing process in sequence. Further, processing conditions for the modifying process are as follows: a processing time is about 30 seconds; about 350 sccm of $O_2$ is used as a processing gas; a pressure is about 13 Pa (about 100 mT); and a high frequency power HF and a high frequency power LF are about 600 W and 0 W, respectively. Further, processing conditions for the first removing process are as follows: a processing time is about 15 seconds; about 95 sccm of $CF_4$ and about 5 sccm of $O_2$ are used as a processing gas; a pressure is about 2.7 Pa (about 20 mT); and a high frequency power HF and a high frequency power LF are about 600 W and 0 W, respectively. Furthermore, processing conditions for the second removing process are as follows: a processing time is about 2 seconds; a pressure is about 1.3 Pa (about 10 mT); and a high frequency power HF and a high frequency power LF are about 300 W and 0 W, respectively.

As depicted in FIG. 7A and FIG. 7B, in case of performing the second removing process after performing the modifying process and the first removing processing in sequence, a removing amount ΔT of the test chip is found to be increased, as compared to the case of performing the second removing process without performing the modifying process and the first removing process. That is, by performing the modifying process and the first removing process before performing the second removing process, it is possible to increase the removing amount of the Ti-containing film adhering to the inner wall 11a of the chamber 11, as compared to the case without performing the modifying process and the first removing process. This may be because the TiO film having resistance to the chlorine-containing gas is previously removed from a surface of the Ti-containing film as a result of a reaction between the TiO film and the second fluorine-containing gas and, thereafter, a residual film of the Ti-containing film is removed as a complex gas as a result of a reaction between the residual film of the Ti-containing film and plasma of the chlorine-containing gas used in the second removing process.

Figure 8A:
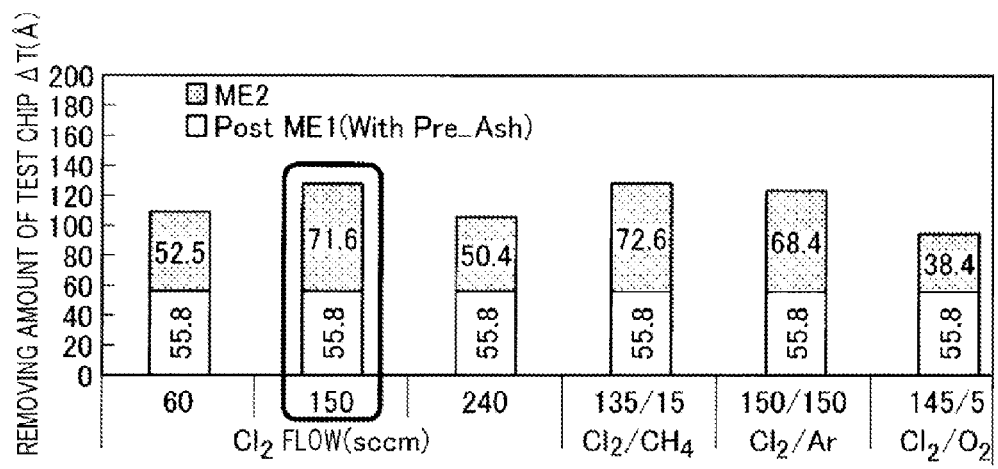
FIG. 8A is a chart showing a relationship between the kind of a chlorine-containing gas used in the second removing process and the removing amount of the Ti-containing film in accordance with the example embodiment.
Figure 8B:
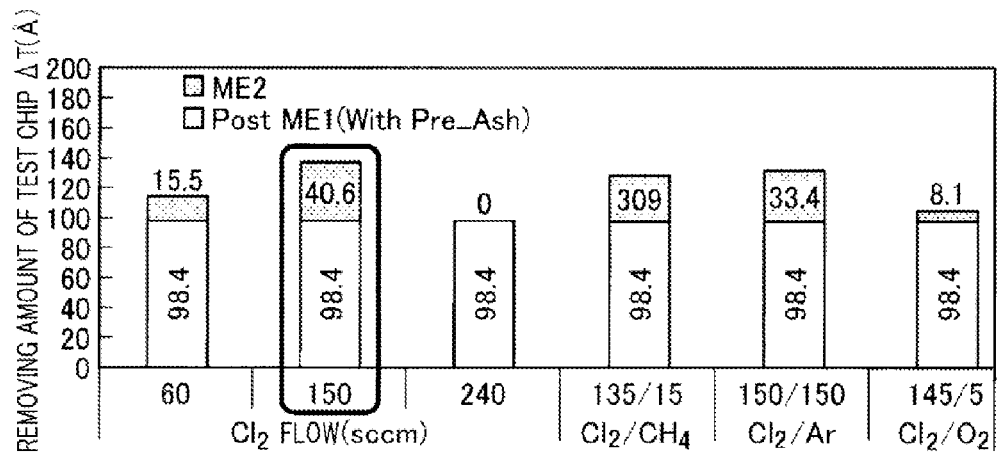
FIG. 8B is a chart showing a relationship between the kind of the chlorine-containing gas used in the second removing process and the removing amount of the Ti-containing in accordance with the example embodiment.

FIG. 8A and FIG. 8B are charts showing a relationship between the kind of the chlorine-containing gas used in the second removing process and a removing amount of the Ti-containing film in the present example embodiment. FIG. 8A provides a result of measuring a removing amount $\Delta T$ of a test chip as a removing amount of the Ti-containing film when the test chip is placed at a preset position A on the inner wall 11a of the chamber 11. Further, FIG. 8B provides a result of measuring a removing amount $\Delta T$ of a test chip as a removing amount of the Ti-containing film when the test chip is placed at a preset position B, lower than the preset position A, on the inner wall 11a of the chamber 11.

Further, FIG. 8A and FIG. 8B provide a result obtained when about 60 sccm of $Cl_2$ is used as the chlorine-containing gas in the second removing process, a result obtained when about 150 sccm of $Cl_2$ is used as the chlorine-containing gas in the second removing process, a result obtained when about 240 sccm of $Cl_2$ is used as the chlorine-containing gas in the second removing process, a result obtained when about 135 sccm of $Cl_2$ and about 15 sccm of $CH_4$ are used as the chlorine-containing gas in the second removing process, a result obtained when about 150 sccm of $Cl_2$ and about 150 sccm of Ar are used as the chlorine-containing gas in the second removing process, and a result obtained when about 145 sccm of $Cl_2$ and about 5 sccm of $O_2$ are used as the chlorine-containing gas in the second removing process.

Further, in FIG. 8A and FIG. 8B, a graph of 'Post ME1 (With Pre_Ash)' shows a result of performing the modifying process and the first removing process in sequence, and a graph of 'ME2' shows a result of performing the second removing process after performing the modifying process and the first removing process in sequence. Further, processing conditions for the modifying process are as follows: a processing time is about 30 seconds; about 350 sccm of $O_2$ is used as a processing gas; a pressure is about 13 Pa (about 100 mT); and a high frequency power HF and a high frequency power LF are about 600 W and 0 W, respectively. Further, processing conditions for the first removing process are as follows: a processing time is about 15 seconds; a pressure is about 2.7 Pa (about 20 mT); and a high frequency power HF and a high frequency power LF are about 600 W and 0 W, respectively. Furthermore, processing conditions for the second removing process are as follows: a processing time is about 2 seconds; a pressure is about 1.3 Pa (about 10 mT); and a high frequency power HF and a high frequency power LF are about 300 W and 0 W, respectively.

As can be seen from FIG. 8A and FIG. 8B, by using about 150 sccm of $Cl_2$, it is possible to increase a removing amount $\Delta T$ of the test chip, as compared to the cases of using about 60 sccm and about 240 sccm of $Cl_2$. Further, by using about 150 sccm of $Cl_2$, it is also possible to increase a removing amount $\Delta T$ of the test chip, as compared to the cases of using the mixture of about 135 sccm of $Cl_2$ and about 15 sccm of $CH_4$, the mixture of about 150 sccm of $Cl_2$ and about 150 sccm of Ar, and the mixture of about 145 sccm of $Cl_2$ and about 5 sccm of $O_2$.

As stated above, by selecting $Cl_2$ as the chlorine-containing gas in the second removing process, it is possible to increase the removing amount $\Delta T$ of the test chip, as compared to the case of using $Cl_2/CH_4$, $Cl_2/Ar$ or $Cl_2/O_2$. That is, by selecting $Cl_2$ as the chlorine-containing gas in the second removing process, it is possible to increase the removing amount of the Ti-containing film adhering to the inner wall 11a of the chamber 11, as compared to the case of using $Cl_2/CH_4$, $Cl_2/Ar$ or $Cl_2/O_2$. This may be because a residual film of the Ti-containing film is removed as TiCl (complex gas) as a result of a reaction between the plasma of the chlorine-containing gas and the residual film of the Ti-containing film which is obtained after the first removing process.

Figure 9A:
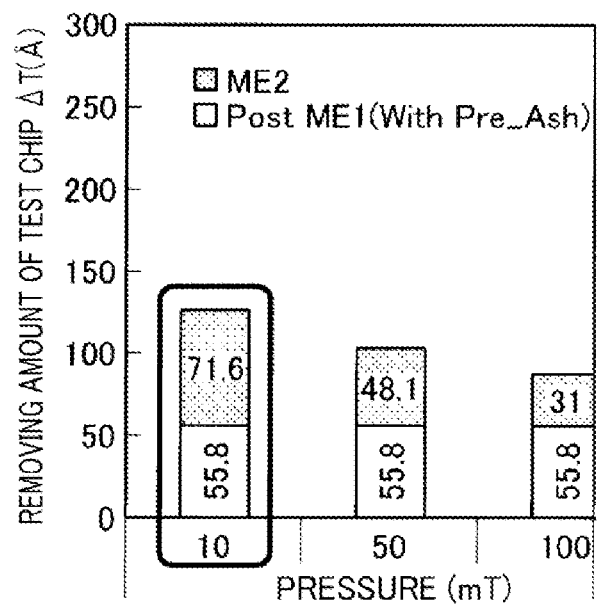
FIG. 9A is a chart showing a relationship between a pressure in the second removing process and the removing amount of the Ti-containing film in accordance with the example embodiment.
Figure 9B:
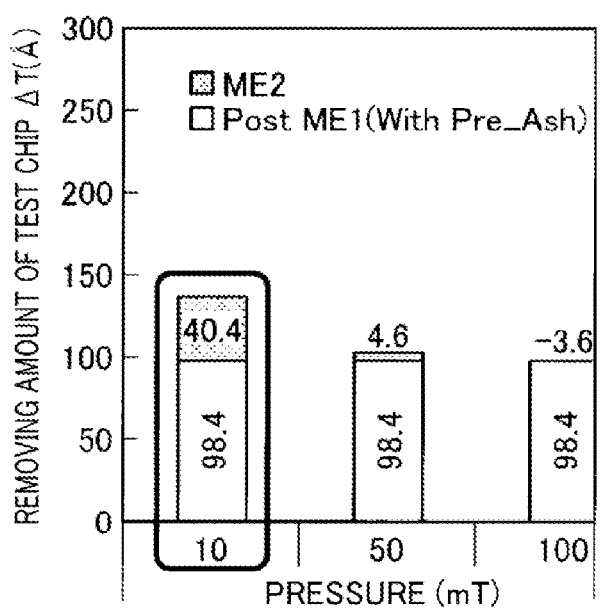
FIG. 9B is a chart showing a relationship between the pressure in the second removing process and the removing amount of the Ti-containing film in accordance with the example embodiment.

FIG. 9A and FIG. 9B are charts showing a relationship between a pressure in the second removing process and a removing amount of the T-containing film in the present example embodiment. FIG. 9A provides a result of measuring the removing amount $\Delta T$ of a test chip as the removing amount of the Ti-containing film when the test chip is placed at a preset position A on the inner wall 11a of the chamber 11. FIG. 9B provides a result of measuring a removing amount $\Delta T$ of a test chip as a removing amount of the Ti-containing film when the test chip is placed at a preset position B, lower than the preset position A, on the inner wall 11a of the chamber 11.

FIG. 9A and FIG. 9B provide a result obtained when the pressure in the second removing process is about 1.3 Pa (about 10 mT), a result obtained when the pressure in the second removing process is about 6.7 Pa (about 50 mT), and a result obtained when the pressure in the second removing process is about 13 Pa (about 100 mT).

Further, in FIG. 9A and FIG. 9B, a graph of 'Post ME1 (With Pre_Ash)' shows a result of performing the modifying process and the first removing process in sequence, and a graph of 'ME2' shows a result of performing the second removing process after performing the modifying process and the first removing process in sequence. Further, processing conditions for the modifying process are as follows: a processing time is about 30 seconds; about 350 sccm of $O_2$ is used as a processing gas; a pressure is about 13 Pa (about 100 mT); and a high frequency power HF and a high frequency power LF are about 600 W and 0 W, respectively. Further, processing conditions for the first removing process are as follows: a processing time is about 15 seconds; a pressure is about 2.7 Pa (about 20 mT); and a high frequency power HF and a high frequency power LF are about 600 W and 0 W, respectively. Furthermore, processing conditions for the second removing process are as follows: a processing time is about 2 seconds; and a high frequency power HF and a high frequency power LF are about 300 W and 0 W, respectively.

As can be seen from FIG. 9A and FIG. 9B, by setting the pressure in the second removing process to be about 1.3 Pa (about 10 mT) lower than the pressure in the first removing process, it is possible to increase a removing amount $\Delta T$ of the test chip as compared to the case of setting the pressure in the second removing process to be about 6.7 Pa (about 50 mT) or about 13 Pa (about 100 mT) higher than the pressure in the first removing process.

As stated above, by performing the second removing process while setting the pressure lower than that in the first removing process, it is possible to further increase the removing amount $\Delta T$ of the test chip. That is, by performing the second removing process while setting the pressure lower than that in the first removing process, it is possible to increase the removing amount of the Ti-containing film adhering to the inner wall 11a of the chamber 11.

As discussed above, in accordance with the present example embodiment, after etching the insulating film with the TiN film as a mask, the modifying process of modifying, between the carbon-containing film and the Ti-containing film adhering to the components within the chamber 11, the surface of the Ti-containing film 202 by the plasma of the oxygen-containing gas while removing the carbon-containing film 201 by the plasma of the oxygen-containing gas, the first removing process of removing the TiO film 202b obtained through the surface modification of the Ti-containing film from the residual film 202a of the Ti-containing film by the plasma of the second fluorine-containing gas, and the second removing process of removing the residual film 202a of the Ti-containing film exposed through the removal of the TiO film from the components within the chamber 11 by the plasma of the chlorine-containing gas are performed. Accordingly, in accordance with the present example embodiment, even if the Ti-containing film generated from the TiN film adheres to the various components within the chamber 11, it is possible to remove the Ti-containing film from the various components. Thus, it is possible to suppress fluctuation in plasma density within the chamber 11. As a result, in accordance with the present example embodiment, it may be possible to suppress the etching characteristics from being degraded with a lapse of time due to the Ti-containing film adhering to the inside of the chamber 11.

Further, in accordance with the present example embodiment, the second fluorine-containing gas may include $CF_4$ or $SF_6$. Thus, it is possible to remove the TiO film 202b, which is obtained through the surface modification of the Ti-containing film 202 adhering to the components within the chamber 11, from the residual film 202a of the Ti-containing film.

In addition, in accordance with the present example embodiment, the second fluorine-containing gas may further include $O_2$. As a result, it is possible to remove the TiO film 202b, which is obtained through the surface modification of the Ti-containing film 202 adhering to the components within the chamber 11, from the residual film 202a of the Ti-containing film more efficiently.

Moreover, in accordance with the present example embodiment, the chlorine-containing gas may include at least one of $Cl_2$, $BCl_3$ and $SiCl_4$. As a result, the residual film 202a of the Ti-containing film 202 reacts with the plasma of the chlorine-containing gas, so that the residual film 202a of the Ti-containing film 202 can be efficiently removed as TiCl as the complex gas.

Further, in accordance with the present example embodiment, the modifying process, the first removing process and the second removing process are performed after unloading the processing target object from the chamber 11. As a result, it is possible to efficiently remove the Ti-containing film adhering to the various components within the chamber 11 without being affected by materials from the processing target object.

Furthermore, in accordance with the present example embodiment, the second removing process is performed at a pressure lower than that in the first removing process. As a result, it is possible to accelerate the reaction in which the residual film 202a of the Ti-containing film 202 reacts with the plasma of the chlorine-containing gas to allow the residual film 202a of the Ti-containing film 202 to be formed into TiCl as the complex gas. Therefore, the residual film 202a of the Ti-containing film 202 can be removed as the complex gas TiCl more efficiently.

Other Example Embodiments

The above-described example embodiment of the plasma processing method and the plasma processing apparatus is not limiting, and other example embodiments may be provided as follows.

By way of example, before etching an insulating film with a TiN film as a mask, it may be possible to perform a patterning process of forming a present pattern on the TiN film. In such a case, the etching process, a modifying process, a first removing process and a second removing process may be performed after performing the patterning process. For example, in the patterning process, the preset pattern is formed on the TiN film formed on the insulating film by performing a plasma process with plasma of $Cl_2/CF_4/CH_4/Ar$. Thereafter, the etching process, the modifying process, the first removing process and the second removing process are performed. As a result, even if a Ti-containing film generated from the patterned TiN film and the etched TiN film adhere to various components within the chamber 11, it may be possible to remove the Ti-containing film from the various components.

Further, the aforementioned example embodiments have been described for the case of performing the modifying process, the first removing process and the second removing process after unloading the processing target object from the chamber 11, but the example embodiments may not be limited thereto. By way of example, the modifying process, the first removing process and the second removing process may also be conducted without unloading a dummy wafer or the like from the chamber 11.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. A plasma processing method, comprising:
   an etching process of etching an insulating film formed on a processing target object placed in a chamber by plasma of a first fluorine-containing gas with a TiN film having a preset pattern as a mask;
   an unloading process of unloading the processing target object out of the chamber after the etching process;
   a modifying process of modifying, between a carbon-containing film and a Ti-containing film adhering to a component within the chamber, a surface of the Ti-containing film by plasma of an oxygen-containing gas while removing the carbon-containing film by the plasma of the oxygen-containing gas, after the unloading process;
   a first removing process of removing a TiO film, which is obtained by modifying the surface of the Ti-containing film, by plasma of a second fluorine-containing gas; and
   a second removing process of removing a residual film of the Ti-containing film, which is exposed by removing the TiO film, from the component within the chamber by plasma of a chlorine-containing gas.

2. The plasma processing method of claim 1, wherein the second fluorine-containing gas includes $CF_4$ or $SF_6$.

3. The plasma processing method of claim 2, wherein the second fluorine-containing gas further includes $O_2$.

4. The plasma processing method of claim 1, wherein the chlorine-containing gas includes at least one of Cl2, $BCl_3$ and $SiCl_4$.

5. The plasma processing method of claim 1, further comprising:
   a patterning process of forming the preset pattern on the TiN film, before the etching process.
6. The plasma processing method of claim 1, wherein the second removing process is performed at a pressure lower than that in the first removing process.

* * * * *